(12) United States Patent
Stemmer

(10) Patent No.: US 10,126,401 B2
(45) Date of Patent: Nov. 13, 2018

(54) MAGNETIC RESONANCE METHOD AND APPARATUS

(71) Applicant: Siemens Aktiengesellschaft, Munich (DE)

(72) Inventor: Alto Stemmer, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 903 days.

(21) Appl. No.: 14/627,314

(22) Filed: Feb. 20, 2015

(65) Prior Publication Data

US 2015/0234027 A1    Aug. 20, 2015

(30) Foreign Application Priority Data

Feb. 20, 2014  (DE) .......................... 10 2014 203 113

(51) Int. Cl.
| | | |
|---|---|---|
| *G01R 33/565* | (2006.01) | |
| *G01R 33/30* | (2006.01) | |
| *G01R 33/54* | (2006.01) | |
| *G01R 33/563* | (2006.01) | |
| *G01R 33/561* | (2006.01) | |
| *G01R 33/383* | (2006.01) | |

(52) U.S. Cl.
CPC ..... *G01R 33/56572* (2013.01); *G01R 33/307* (2013.01); *G01R 33/383* (2013.01); *G01R 33/543* (2013.01); *G01R 33/546* (2013.01); *G01R 33/5613* (2013.01); *G01R 33/5616* (2013.01); *G01R 33/56383* (2013.01)

(58) Field of Classification Search
CPC ............ G01R 33/56572; G01R 33/307; G01R 33/543; G01R 33/546; G01R 33/56383; G01R 33/5616; G01R 33/5613; G01R 33/383
See application file for complete search history.

(56) References Cited

U.S. PATENT DOCUMENTS

| | | | | |
|---|---|---|---|---|
| 7,372,988 B2* | 5/2008 | Yoakum-Stover | .... | G06T 7/0012 128/920 |
| 7,511,489 B2* | 3/2009 | Fautz | ................. | G01R 33/5611 324/307 |
| 7,519,412 B2* | 4/2009 | Mistretta | ................ | A61B 5/055 250/363.04 |

(Continued)

OTHER PUBLICATIONS

Ludwig, et al.:"Multiple Volume Coverage in Continuously Moving Table Acquisitions Applied to Free Breathing STIR imaging"; Proceedings of the International Society for Magnetic Resonance in Medicine, 13th Scientific Meeting and Exhibition; pp. 1962; (2005).

(Continued)

*Primary Examiner* — Dixomara Vargas
(74) *Attorney, Agent, or Firm* — Schiff Hardin LLP

(57) ABSTRACT

In a method and magnetic resonance (MR) tomography system for generating image data of a subject to be examined, situated in an MR scanner, during a magnetic resonance measurement the subject is repeatedly moved back and forth relative to a magnet/gradient system of the MR scanning between a starting position and an end position. During this movement, portions of a total raw image data set, which is required for the reconstruction of image data for slices of an image stack in the subject, are in each case acquired in different sweeps from the starting position to the end position and/or from the end position to the starting position.

14 Claims, 5 Drawing Sheets

(56) References Cited

U.S. PATENT DOCUMENTS

| | | | | |
|---|---|---|---|---|
| 7,840,051 B2* | 11/2010 | Razeto | ............... | G06T 7/136 |
| | | | | 382/131 |
| 8,036,730 B1* | 10/2011 | Damadian | ............ | A61B 5/0555 |
| | | | | 324/307 |
| 8,175,359 B2* | 5/2012 | O'Halloran | ........ | G01R 33/4824 |
| | | | | 382/131 |
| 8,194,937 B2* | 6/2012 | Chen | ............... | G06T 11/006 |
| | | | | 382/118 |
| 8,362,771 B2* | 1/2013 | Dornhaus | ............ | G01R 33/243 |
| | | | | 324/309 |
| 8,374,413 B2* | 2/2013 | Chen | ............... | G06T 11/006 |
| | | | | 378/901 |
| 8,421,021 B2* | 4/2013 | Sachs | ............... | G06T 11/005 |
| | | | | 250/336.1 |
| 8,509,514 B2* | 8/2013 | Chen | ............... | G06T 11/006 |
| | | | | 378/901 |
| 8,519,706 B2* | 8/2013 | Landschuetz | .......... | A61B 5/055 |
| | | | | 324/306 |
| 8,526,702 B2* | 9/2013 | Johnston | ............ | G06T 11/008 |
| | | | | 382/128 |
| 8,825,138 B2* | 9/2014 | Mistretta | ............ | A61B 6/482 |
| | | | | 382/128 |
| 9,192,781 B2* | 11/2015 | Ichihashi | ............ | A61B 6/542 |
| 9,470,772 B2* | 10/2016 | Reisman | .......... | G01R 33/56572 |
| 9,541,622 B2* | 1/2017 | Kartmann | ............ | A61B 5/0035 |
| 2003/0011369 A1 | 1/2003 | Brittain et al. | | |
| 2009/0033327 A1 | 2/2009 | Aldefeld et al. | | |
| 2010/0289493 A1 | 11/2010 | Stemmer | | |
| 2011/0112392 A1 | 5/2011 | Boernert et al. | | |
| 2012/0253175 A1 | 10/2012 | Riederer et al. | | |
| 2013/0053683 A1 | 2/2013 | Hwang et al. | | |

OTHER PUBLICATIONS

Börnert et.al.: "Principles of Whole-Body Continuously-Moving-Table MRI", Journal of magnetic resonance imaging, No. 28, pp. 1-12; (2008).

Fautz et.al.: "Sliding Multislice (SMS): A New Technique for Minimum FOV Usage in Axial Continuously Moving-Table Acquisitions", Magnetic Resonance in Medicine, No. 55pp. 363-370; (2006).

* cited by examiner

MAGNETIC RESONANCE METHOD AND APPARATUS

BACKGROUND OF THE INVENTION

Field of the Invention

The invention relates to a method for generating magnetic resonance image data of a subject to be examined by operation of a magnetic resonance scanner, wherein the subject to be examined is transported on an apparatus table or a patient table relative to a magnet/gradient system of the magnetic resonance scanner during a magnetic resonance measurement and raw image data are acquired. Image data of the slices can then be reconstructed on the basis of said raw image data. The invention further relates to a magnetic resonance tomography system having a magnetic resonance scanner, as well as a control device in order to carry out such a method.

Description of the Prior Art

In a magnetic resonance system, the body to be examined is normally subjected to a relatively high constant magnetic field, the so-called "B0 field", for example of 3 or 7 Tesla, with the use of a basic field magnet system. In addition, a magnetic field gradient is created by a gradient system. Radio-frequency excitation signals (RF pulses), the so-called "B1 field", are then emitted by a radio-frequency transmitter system having suitable antenna facilities, which is intended to cause the nuclear spins of particular atoms resonantly excited by the radio-frequency field to be flipped (deflected) in a spatially resolved fashion by a defined flip angle with respect to the magnetic field lines of the constant magnetic field. When relaxation of the nuclear spins occurs, radio-frequency signals, so-called magnetic resonance signals, are emitted that are received by suitable reception antennas, and are then processed further. In this situation the data acquisition takes place, for example, line by line in the spatial frequency domain, known as "k-space". On the basis of this raw data, a reconstruction of the image data which represents a reproduction of the interior of the subject to be examined in the "real" spatial domain, then takes place using a Fourier transform.

Earlier MR systems use the same coil as the transmit coil and reception coil, namely a so-called "volume coil" or "body coil" permanently installed in the scanner. A typical structure of a volume coil is a cage-type antenna (birdcage antenna) composed of multiple rods that proceed parallel to the longitudinal axis around a patient chamber of the scanner in which a patient is situated during the examination. At each end, the antenna rods are circularly connected with a capacitor between each pair of adjacent rods. Conventionally, the volume coil is used only as a transmit coil during the radio-frequency irradiation in order to produce as homogeneous a B1 field as possible perpendicular to the direction of the constant magnetic field. Signal reception however takes place most often using a dedicated reception coil, usually referred to as a "local coil", which is placed as close as possible to the organ to be examined of the patient.

Measurements with a table traveling continuously through the magnet of the magnetic resonance scanner serve to extend the field of view in the direction of the table displacement (FOVz) and simultaneously to restrict the measuring range inside the magnet, for example to a small region around the isocenter of the magnetic resonance scanner, which is the location of maximum homogeneity of the magnetic field and maximum linearity of the gradient system. A technique competing with continuous table feed is the acquisition of the FOV extended in the table feed direction in a number of stations with the table at a standstill in each case. In this case, after all the data from one station has been acquired, the patient is moved by the patient table to the next station, and the measurement is paused during this movement.

Conventionally, sequences having a very short repetition time (usually, and in the following, denoted as TR) are principally used in the case of acquisition techniques employing continuous feeding of the patient table.

These include, for example, sequences such as TrueFISP ("True Fast Imaging with Steady state Precession") or proton density-weighted FLASH ("Fast Low Angle Shot") sequences. In the case of sequences having a very short repetition time, it is possible to consecutively (successively) acquire the raw image data for an individual slice in the center the magnet while the patient (or, more generally, the subject to be examined) is being moved at constant speed $$V_{table} = \frac{d}{N_{exc}TR} \tag{1}$$

through the system. In this case TR denotes the time between the successive excitation of a slice and $N_{exc}$ denotes the number of excitations per slice which is needed in order to acquire the raw image data for coding an image. When using a Cartesian acquisition technique, in the simplest case (without using parallel acquisition techniques) $N_{exc}$ is for example equal to the number of phase-encoding steps per slice. When using a radial acquisition technique, in the simplest case (one spoke per excitation) $N_{exc}$ is equal to the number of spokes measured per image. In the formula (1), d is the distance between adjacent slices (measured from center to center).

In the case of this successive acquisition technique, the data for a first slice are acquired completely before the data acquisition for a further slice commences.

Furthermore, a technique using continuous table feed has become available in which sequences having a moderate TR (such as for example in the case of T1-weighted imaging with FLASH) or a long TR (such as for example in the case of T2-weighted turbo spin echo sequences) are also employed. Since the classical scanning technique using continuous table feed (in other words the successive acquisition of each slice just as it passes through the isocenter of the system) would as a consequence of the long repetition time TR result in this case in an extremely slow table speed and thus to an extremely long examination time (and correspondingly low efficiency), an interleaving technique is generally employed, wherein the data for each slice are acquired at different positions within the magnetic resonance tomograph. This acquisition technique increases the efficiency compared with the classical acquisition technique but also has the actual advantages of the techniques having continuous table feed, namely the acquisition of all slices and data close to the isocenter. Rather, the interleaving results in different data from one and the same slice (in the subject to be examined or patient) necessarily being acquired at different locations within the magnetic resonance scanner. This is a new possible source of artifacts because different scanning conditions exist at different locations within the magnetic resonance scanner due to the imperfect homogeneity of the magnetic field and the imperfect linearity of the gradient system.

SUMMARY OF THE INVENTION

An object of the present invention is to provide a method and a magnetic resonance tomography system with which sequences having a long TR can be used efficiently with continuous table feed, but wherein the risk of artifacts due to field inhomogeneities between different measuring positions is reduced.

This object is achieved by a method according to the invention wherein, as described above, raw image data for the subject to be examined are acquired during a magnetic resonance measurement while the subject to be examined is moved relative to the magnet/gradient system of the magnetic resonance scanner, with simultaneous table feed for example. In this situation the motion can take place continuously at a uniform speed, or at a varying speed, in which case it is likewise possible for the motion to be stopped intermittently and then resumed after a certain pause.

In this situation raw image data for an image stack are preferably acquired in a 2D axial measurement, wherein preferably relatively thin 2D slices are acquired in each case, and by a slice package formed therefrom a particular two-dimensional volume is densely acquired in this situation. In this case the slice selection is effected in the z direction proceeding in the direction of motion (table feed direction for example) by a suitable simultaneous activation of gradient pulses and radio-frequency pulses. The spatial resolution in the x and y directions, perpendicular to the z direction, is effected by the readout gradient, which is usually from right to left with respect to the patient, and a phase-encoding gradient, which proceeds perpendicularly to the table in the anterior/posterior direction with respect to the patient. In accordance with the present invention the raw image data are preferably read out perpendicularly to the table feed direction, or the direction of motion proceeds perpendicularly to the image plane.

According to the invention, during a magnetic resonance measurement (data acquisition) the subject to be examined is now repeatedly moved back and forth relative to the magnet/gradient system, between a starting position and an end position. This can be accompanied by, as is usual, the patient being moved on the movable table in the magnet/gradient system, and/or the magnet/gradient system is moved. Portions of a complete raw image data set, which is required for the reconstruction of image data for slices of a previously defined image stack, are in each case acquired in different movement sweeps from the starting position to the end position and/or from the end position to the starting position. In other words, the acquisition of the raw image data takes place such that the raw image data for a particular (one and the same) image stack originates from multiple of movement sweeps.

On the basis of the raw image data, image data for the slices can then be reconstructed in the usual manner. Raw image data in this situation are understood to be the raw data entered into k-space, from which the image data are reconstructed. Raw image data thus do not include; for example, any adjustment or calibration data or coil sensitivities that where applicable and that may be acquired at the same time during the sweeps or in further separate sweeps.

The raw data are preferably raw image data for producing image data of an individual contrast (in other words for example proton density-weighted contrast, T1-weighted contrast, T2-weighted contrast, diffusion-weighted contrast) of the image stack, which originates from multiple sweeps. This also applies if image data having different contrasts are acquired in total for the slices of an image stack.

The present invention thus introduces a new scanning technique in which data for one slice, as in the case of the classical technique employing continuous table feed, can then exclusively be acquired when the slice passes through the isocenter, or a close region around the isocenter, of the magnetic resonance scanner. Different excitations of a particular slice and/or adjacent slices of a slice package can in this situation, as the later examples show, advantageously take place in different, directly or indirectly successive sweeps. As a result of this "shuttle technique" the advantages of the classical technique are retained but the table speed and thereby the efficiency are decoupled from the contrast-determining parameters (in particular the repetition time TR). The technique according to the invention is therefore particularly suited for sequences in which a complete relaxation of the tissue preferably occurs between the different excitations of a particular slice, in other words in particular T2-weighted imaging processes with turbo spin echo sequences and diffusion-weighted imaging with spin echo echoplanar sequences (EPI). The invention is not, however, restricted to such sequences.

In addition to the magnetic resonance scanner having a magnet/gradient system, the magnetic resonance tomography system according to the invention requires, as mentioned above, a corresponding control device that is designed in order to operate the magnetic resonance scanner during a magnetic resonance measurement such that the subject to be examined is repeatedly transported back and forth relative to a magnet/gradient system of the magnetic resonance scanner between a starting position and an end position and during this movement portions of a raw image data set, which is required for the reconstruction of image data for slices of an image stack, are in each case acquired in different sweeps between the starting position and the end position (in other words from the starting position to the end position and/or from the end position to the starting position).

Such a magnetic resonance tomography system preferably also has a suitable reconstruction computer designed to reconstruct image data for the slices of the image stack on the basis of the raw image data acquired in the different sweeps.

For example, for this purpose the reconstruction computer could have a raw data sorter and/or buffer unit in which the raw image data from the different sweeps are buffered, and sorted appropriately for the slices in each case, until the totality of raw image data required for the reconstruction of the image data for the slice in question is available. Only then does the image reconstruction take place in an (in principle conventional) reconstruction unit of the reconstruction facility.

The reconstruction computer can be part of the control computer of the magnetic resonance tomography system. It can also be implemented as a separate computer of the magnetic resonance tomography system, for example at a terminal connected thereto, etc. In particular, the control computer and/or the reconstruction computer or essential parts thereof can be designed in the form of software components. The invention thus also encompasses a non-transitory, computer-readable data storage medium that can be loaded directly into a memory of a control computer of a magnetic resonance tomography scanner, having a program code in order to execute all the steps of the method according to the invention when the program is executed in the control computer. The control computer can be constructed as a system composed of multiple processors networked with one another. A software implementation has the advantage that existing magnetic resonance tomography systems, implemented using suitable programmable processors and memories, can be modified through implementation of the program in a suitable manner in order to function in the manner according to the invention.

Individual features or groups of features of different exemplary embodiments of the invention can be combined to produce further exemplary embodiments.

The optimum implementation of a method according to the invention for performing sensitivity measurements in 2D axial measurements with table feed perpendicular to the image plane depends on the sequence type used for the imaging measurement utilized. It is again necessary here to distinguish between three different basic families of imaging sequence types.

The first family includes the sequences having a short TR already described above in conjunction with formula (1), such as TrueFISP or proton density-weighted FLASH sequences. With said sequences, acquisition of the raw data using the conventional methods is also quite possible, but the use of a method according to the invention is naturally not excluded.

The second family includes sequences having a longer TR such as T1-weighted FLASH techniques and in particular T2-weighted multi-shot turbo spin echo sequences (TSE), in which a TR of 70 ms (for T1 weighting with FLASH) up to several seconds (for T2 weighting with TSE) is required in order to achieve a desired contrast or to maintain the signal. In particular, with this sequence family the conventional method described in the introduction would become very inefficient because according to formula (1) the long TR results in a very low table speed at a slice increment of d=3 to 8 mm typical in MRT.

In particular, for sequence types of this family, in a preferred variant of the method according to the invention parts of a raw image data set that are required for the reconstruction of image data for a slice of the image stack are acquired in different sweeps from the starting position to the end position and/or from the end position to the starting position. In other words, the raw data acquisition for an individual slice is distributed over multiple of sweeps.

If, in order to acquire a raw image data set for the image data for a slice of the slice package a multiple excitation of the slice is required, then in an embodiment of the method the slice in question of the slice package can in each case be excited a maximum of once per sweep from the starting position to the end position and/or from the end position to the starting position when it is situated in a defined position region relative to the magnet/gradient system. Therefore, all the raw image data are recorded at the same position, meaning that possible inhomogeneities or deviations in linearity of the magnetic fields influence all the data for the slice in the same manner, as in the case of a stationary acquisition. By particular preference the defined position region in question is the isocenter of the magnet/gradient system. In this embodiment, the number of sweeps with data acquisition is thus equal to the number of excitations per image or slice of the image stack.

In a further embodiment, in order to acquire a raw image data set for the image data for a slice of the slice package for which a multiple excitation of the slice is required, the slice of the slice package can be excited repeatedly (maximum in each case) per sweep from the starting position to the end position and/or from the end position to the starting position. This preferably takes place again in each case when the slice is situated in a defined position region in the magnet/gradient system, where the defined position regions in which the excitation of the slice occurs in each case during a sweep are spaced from one another. The position regions are preferably still situated in the vicinity of the isocenter in this embodiment, in other words in a region having high homogeneity and good linearity.

In a preferred version of this embodiment, if for example $N_{exc}$ excitations are required in order to acquire one image, each slice is excited up to $CEIL(N_{exc}/N_{sweep})$ times per sweep between the starting position and the end position, where $N_{sweep}$ is the number of sweeps with data acquisition and CEIL(.) means rounding up to the next integer value. The effective volume utilized in the magnet is thereby reduced by approximately a factor of $N_{sweep}$ compared with a conventional acquisition technique with continuous table feed during the measurement.

The second family also includes so-called single-shot sequences in which all the data for producing a so-called "primary image" can be read out following a single excitation, but a number of such "primary images" of each slice must be acquired in the examination in order to reconstruct therefrom the image data actually desired. The reason for the plurality of primary images can be the desired combination of primary images to form one image with an improved signal-to-noise ratio or the acquisition of different contrasts—(for example different diffusion weightings and/or directions with a single-shot echoplanar sequence). The previously described method embodiment is also particularly well suited for this purpose.

The "real" single-shot sequences in which a single excitation per slice is sufficient for acquiring the raw image data set for the image data for a slice of the slice package (for one examination) can here be regarded as a third family. Examples thereof are echoplanar imaging (EPI) or half-Fourier single-shot turbo spin-echo (HASTE) sequences.

With these sequence types, the slice data can in principle be acquired successively as in the case of the first family, in other words the data for a first slice can be acquired completely before data acquisition commences for a further slice. In equation (1), in this situation $N_{exc}$ equals 1 and the TR (which is infinite in the case of real single-shot sequences) is to be replaced by the period of time TS between the acquisition of adjacent slices. This period of time TS is in turn composed of the time TA for acquiring the raw image data for a single slice and a pause TP between the acquisition of adjacent slices. The feed speed is thus given by $$v_{table} = \frac{d}{TA + TP} = \frac{d}{TS} \tag{2}$$

The successive acquisition of adjacent slices is also frequently associated in this family with considerable disadvantages such as SNR loss or impairment of a desired contrast. The reason for this is the crosstalk of the slices. Crosstalk of the slices is understood to be the fact that each selective radio-frequency pulse has an imperfect excitation profile due to its finite duration. It is technically unavoidable that each radio-frequency pulse thus also influences regions that are situated outside the desired slice. This effect occurs most strongly between directly adjacent slices. If an adjacent slice is therefore acquired before the disturbed magnetization has returned to its state of equilibrium (which is the case approximately only after the four- to fivefold T1 time of the tissue), then the signal intensity (and thereby the signal-to-noise ratio) drops as a result and the contrast of the image may change.

Therefore, in a further preferred embodiment of the invention, even if a single excitation of the slice would suffice in order to acquire the raw image data set for the image data for a slice of the slice package (in other words with the sequence types of the third family) it is ensured that different slices of the slice package are only excited (and their raw image data acquired) in one sweep from the starting position to the end position and/or from the end position to the starting position if they are spaced from one another. The raw image data for the other slices can then be acquired in the further sweeps in order to thus acquire the complete raw image data set for the entire image stack. By this procedure it is ensured that sufficient waiting time always remains between the excitation of two adjacent slices so that crosstalk effects are reduced or even entirely avoided. Nevertheless the method—in particular with sequences having a longer TR—is more efficient than in the case of the conventional procedure with a slower feed speed. In contrast to a method employing an interleaved scanning technique, in this situation the excitation of a slice can preferably take place again precisely when it is situated in a defined position region relative to the magnet/gradient system, particularly preferably in the isocenter of the magnet/gradient system.

Preferably, only every n-th slice is excited per sweep from the starting position to the end position and/or from the end position to the starting position. For each sweep, the slices to be excited and to be acquired are then for example displaced (for example by one slice increment). After n sweeps all the slices have then been measured once. The number of sweeps with data acquisition thus equals n. For example, every 2nd slice can be excited or acquired per sweep, meaning that in a first sweep all the "even-numbered" slices are excited and in a second sweep, precisely offset, all the "odd-numbered" slices.

Also among the aforementioned third family, in addition to "real" single-shot sequences in which all the k-space lines of an image are read out following a single radio-frequency excitation pulse, are those sequences having a short TR, such as Turbo-FLASH, in which a so-called selective preparation pulse is employed once per image in order to suppress an undesired signal component or to achieve a desired contrast. The slice thickness of the preparation pulse is normally chosen to be greater in this situation than the slice thickness of the subsequent excitation or refocusing pulses in order to achieve an even preparation of the magnetization. When anatomically adjacent slices are acquired in close temporal succession, this likewise results in the aforementioned crosstalk problems.

Regardless of which sequence type is concerned, there are different strategic procedures in which sweeps raw image data is actually acquired.

In a first variant, acquisition of parts of the raw image data set takes place only during sweeps in one sweep direction, in other words for example only during sweeps from the starting position to the end position or conversely in each case. This means that although "empty sweeps" without data acquisition are required, such an empty sweep can however be utilized in order to the return the magnetization to the state of equilibrium prior to the next sweep. This procedure has the advantage that the slices of the image stack are always acquired in the same order. In particular, if the slice needs to be excited repeatedly in order to acquire raw image data, then it is ensured that the time interval between two successive excitations is approximately the same for all slices.

Alternatively, acquisition of parts of the raw image data set can also take place during sweeps in both sweep directions, in other words both during sweeps from the starting position to the end position and also from the end position to the starting position. This means that the data acquisition process can be accelerated. In particular with such a method, in order to ensure that the magnetization is in the state of equilibrium prior to a new excitation the control can be effected such that a predetermined minimum waiting time is observed between two sweeps. In other words, a sufficiently long pause for relaxation of the magnetization is introduced at the end of a sweep before the return sweep occurs.

DESCRIPTION OF THE PREFERRED EMBODIMENTS

Figure 1:
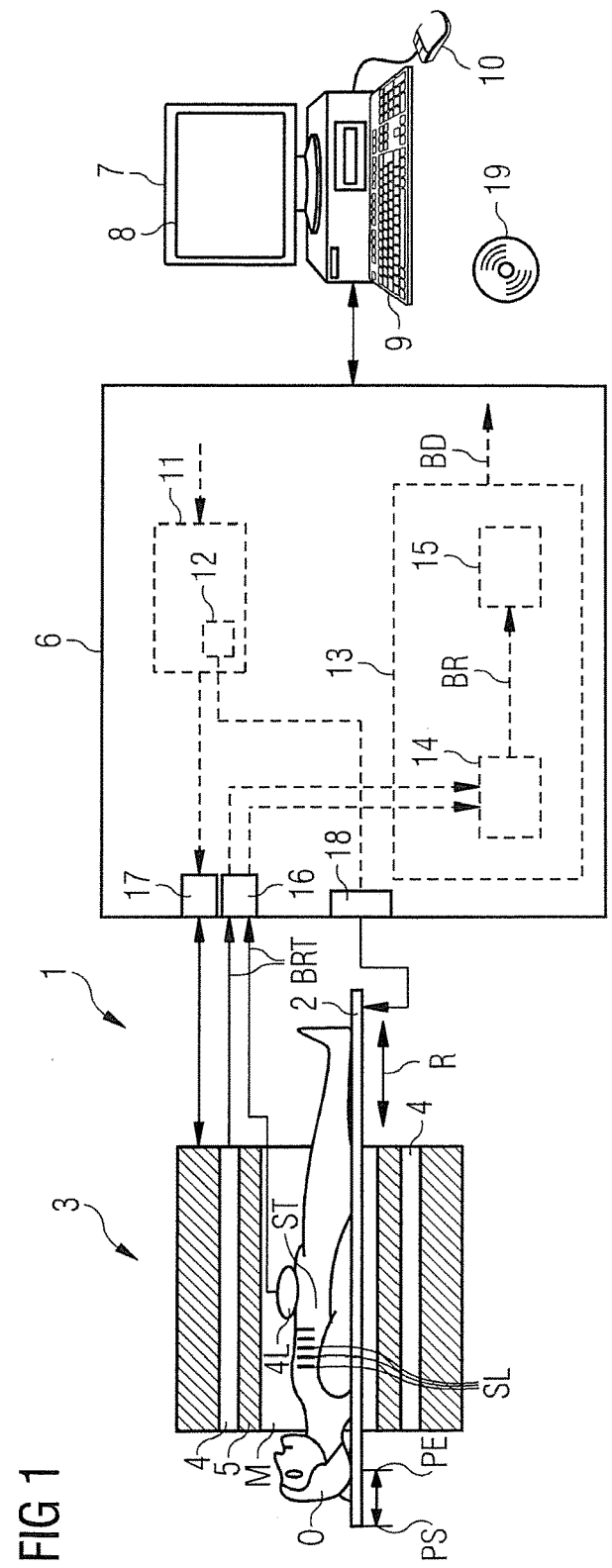
FIG. 1 is a schematic illustration of an exemplary embodiment of a magnetic resonance tomography system according to the invention.

FIG. 1 is a schematic illustration of an exemplary embodiment of a magnetic resonance tomography system 1 according to the invention. The magnetic resonance tomography system 1 has a magnetic resonance scanner 3 having a magnet/gradient system 5 having a basic field magnet system (not shown here in detail) and also gradient coils in the different spatial directions), by means of which the magnetic field required for the magnetic resonance measurement and also the magnetic gradient fields are generated in a measurement chamber M.

A table 2 on which a patient or subject to be examined O can be positioned is situated in the measurement chamber M, also referred to as the patient tunnel. As an antenna system the magnetic resonance scanner 3 as usual has a permanently installed volume coil 4. Additionally situated in the measurement chamber are local coils 4L (only one of which is shown here for the sake of simplicity) positioned on the patient O.

The magnetic resonance tomography system 1 furthermore has a control computer 6 by which the scanner 3 is controlled and magnetic resonance data (in particular raw image data) is acquired by the scanner 3, and a terminal 7 connected to the control computer 6. The control computer 6 includes a drive unit 11 and a reconstruction unit 13 for the raw image data BR.

During a magnetic resonance measurement, portions BRT of raw image data sets BR are acquired by local coils 4L (only one of which is shown) positioned on the patient O in the measurement chamber M and where applicable by the volume coil 4. After preprocessing by a raw data interface 16, the portions BRT are passed to the reconstruction unit 13, in which case the scanner 3 and the table 2 are driven by the drive unit 11 via a control data interface 17 and a table control interface 18, such that a complete raw image data set BR, which is required for reconstructing image data BD for slices SL of a previously specified particular image stack ST, which covers a particular volume of interest inside the body of a patient O lying on the table 2, is ultimately acquired. To this end, the drive unit 11 has a table drive module 12 that according to the invention, ensures that during such a measurement the table 2 with the subject to be examined O is repeatedly transported back and forth between a starting position PS and an end position PE in a table travel direction R (which here corresponds to the longitudinal axis of the magnetic resonance scanner 3). Thus only portions BRT of a raw image data set BR, which is required for reconstructing image data BD for slices SL of an image stack ST, are acquired respectively in different sweeps from the starting position PS to the end position PE and/or from the end position PE to the starting position PS.

The reconstruction unit 13 here includes a raw data sorter and/or buffer unit 14 and an actual image reconstruction processor 15. The reconstruction unit 13 is implemented with all components 14, 15 in the form of software on a suitable processor of the control computer 6. In the raw data sorter and/or buffer unit 14 the different parts BRT of the raw image data for a slice SL from the different sweeps are assigned to the slice SL and buffered until such time as the data suffices for a reconstruction, for example the complete raw image data set BR for the slice has been acquired. The raw image data is then passed to the image reconstruction processor 15, which reconstructs the image data BD for the slice in question from the raw image data BR. This can be done using one of the usual methods known to those skilled in the art.

The image data BD can then be graphically displayed for example on a screen 8 of the terminal 7. Alternatively, the raw image data and/or image data BD can be stored in a bulk storage device (not shown).

In addition to providing a graphical display of the image data BD, the terminal 7, which has a keyboard 9 and a mouse 10 in addition to the screen 8, can be used by a user to predetermine an image stack ST to be measured or the individual slices SL thereof, and to determine further parameters for execution of the method according to the invention. Normally control of the magnetic resonance scanner 3 is effected fully automatically by the control computer 6 during the magnetic resonance measurement by execution of a measurement protocol that the operator has previously selected from a collection of ready-made measurement protocols, and usually modified so that the measurement desired by the operator is performed.

The terminal 7 can also be used for loading the software for the control computer 6, in particular for the image reconstruction unit 13, into the control computer 6. This software for the control computer 6 can embody the method according to the invention. It is also possible for the method according to the invention to be embodied in software that is running on the terminal 7. Regardless of which software embodies the method according to the invention, the software may be stored on a DVD 19 or another data medium, meaning that the software can then be read by the terminal 7 from the DVD 19 and copied either into the control computer 6 or into a processor unit of the terminal 7 itself.

The control data interface 17, the raw data interface 16 and the table control interface 18 are in each case represented in simplified form only as a block. These interfaces actually include multiple individual components. For example, the control data interface 17 has one or more transmit channels with corresponding radio-frequency amplifiers in order to be able to feed RF pulses having the required strength and pulse shape into the volume coil 4, as well as suitable gradient interfaces in order to supply the gradient coils with the appropriate gradient pulses. The raw data interface 16 likewise has a number of receive channels for the volume coil 4 and the different local coils 4L.

It should be noted that such a magnetic resonance tomography system 1, in particular the control computer 6, may also have a number of further components, for example interfaces for connection to a network in order to also pass the raw data and/or the reconstructed image data to other stations, etc. The magnetic resonance scanner 3 can likewise also be constructed differently to that illustrated herein, for example as an open-sided scanner. Since the basic structure of magnetic resonance tomography systems is known to those skilled in the art, for clarity all these components and variants have not been illustrated in FIG. 1 nor described herein in detail.

Various preferred methods are described as examples in the following, with reference to FIGS. 2 to 5. In all the embodiments described in the following, the imaging measurements take place in the form of axial 2D measurements with a table feed perpendicular to the image plane. This means that the readout direction is perpendicular to the table feed direction R.

Figure 2:
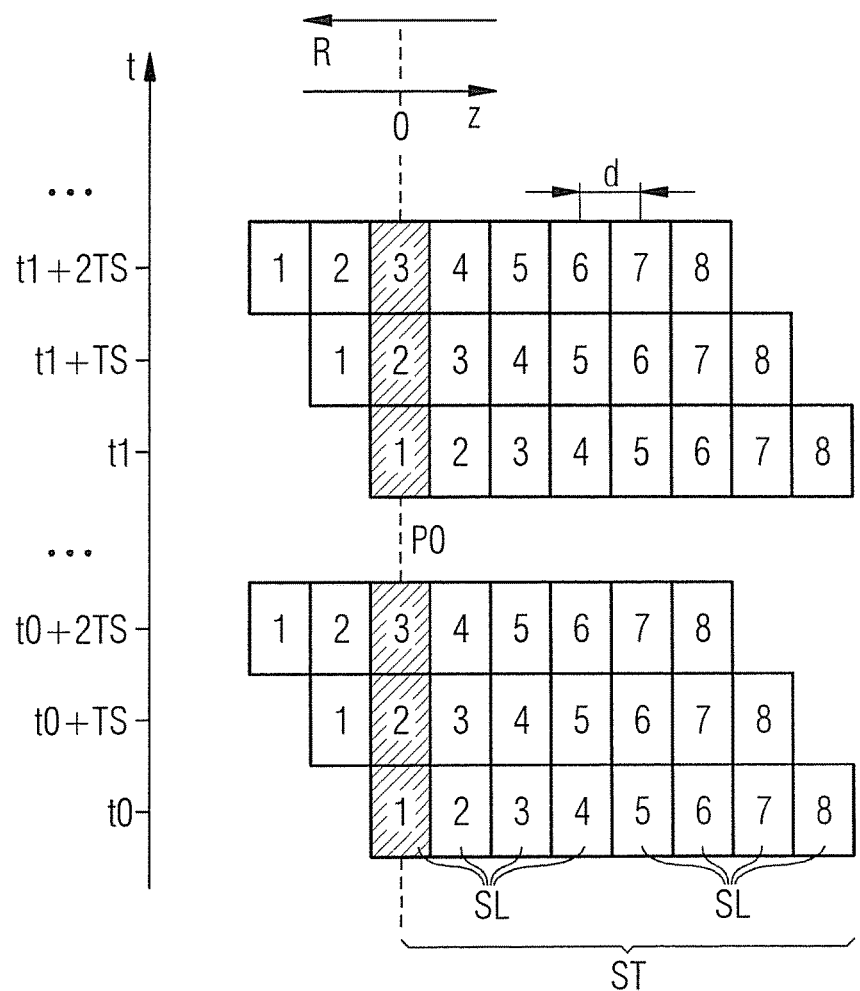
FIG. 2 is a schematic illustration of the execution of a magnetic resonance measurement according to the invention in accordance with a first embodiment.

FIG. 2 shows a first embodiment of the invention. The field of examination is, as is also the case in the further examples in FIGS. 3 to 5, a slice package ST having $N_{slc}=8$ slices SL. The slices are consecutively numbered in each case in FIGS. 2 to 5 using integers 1 to 8, enabling them to be designated individually. The order (sequence) is optional, however. The distance between two adjacent slices SL of this slice package ST is denoted by d. In order to create an image, nuclear spins in each of the slices SL must be excited at least $N_{exc}$ times and the signal emitted as a consequence of an excitation must be spatially-encoded and read out in each case.

To this end, in the first embodiment the table 2 is driven such that, at a first measuring time t0, a first slice "1" is situated in the isocenter (in the position region or at the position P0 corresponding to z=0) of the magnet/gradient system 5 (referred to only as "magnet" for short in the following). This slice is measured at point in time t0. Measured here and in the following means that the slice in question is excited with a radio-frequency pulse and the magnetic resonance signal emitted in consequence of the disturbed state of equilibrium from the spins of said slice is spatially-encoded and read out. That is a process of finite duration that is referred to in the following as acquisition interval TA. Such an acquisition interval TA is assigned a point in time (t0 here) that, for example, coincides with the start or the middle of the acquisition interval TA.

In the first embodiment the value for the table speed $v_1$ is constant and is given by $$|v_1| = \frac{d}{TS} = \frac{d}{TA + TP} \quad (3)$$

wherein d is the distance between adjacent slices. TS is the period of time between the measurement of adjacent slices. This time is in turn composed of the acquisition interval TA per slice and an optional pause TP between the measurement of adjacent slices (see also equation (2)).

The slice increment d is generally predetermined by the user. The acquisition interval is usually implicitly defined by a series of parameters predetermined by the user (such as an echo time, resolution, readout bandwidth, . . . ). The pause TP is in principle freely selectable.

The maximum table speed and thus the greatest efficiency for the method can be achieved when TP=0. Nevertheless there are numerous reasons why a non-zero TP can be the preferred option:
- observance of a maximum design speed
- observance of patient safety, inter alia limited specific absorption rates
- increasing patient comfort
- avoidance of crosstalk between adjacent slices
- limitation of physical effects as a consequence of the table being moved during data acquisition.

The starting position of the table is here preferably chosen such that the first slice is situated in the isocenter of the magnet at point in time t0. If $z_0$ is the table position associated with this point in time t0 (slice "1" in the isocenter), then the starting position PS of the table results therefrom as follows:

$$PS = z_0 + v_1^2 / a_1 \quad (4)$$

wherein $a_1$ is the value of a constant table acceleration during the acceleration phase of the table.

The end position PE of the table is then:

$$PE = z_0 - d \cdot N_{slc} - v_1^2 / a_2 \quad (5)$$

wherein $a_2$ is the value of a constant table acceleration during the braking phase of the table.

In the examples shown in FIGS. 2 to 5, the acquisition order is descending in each case (for which reason the directional arrow R is intended to point from greater z positions to smaller z positions, in other words from positive to negative z values with reference to the isocenter at z=0). Without limiting the generality of the invention, this is where the negative signs in the equation originate.

In this first embodiment according to FIG. 2 the number of sweeps with data acquisition is equal to the number of excitations. In this situation the data acquisition can take place either in one sweep direction (in other words only during sweeps from the starting position to the end position, as in FIG. 2, or vice versa) or in both sweep directions. This second alternative is illustrated schematically in FIG. 3.

In the first variant according to FIG. 2 (one sweep direction) after reaching the end position PE the table is returned to the starting position PS. For reasons of efficiency the return sweep generally takes place at a higher speed $v_{return}$ than the sweeps with data acquisition.

The repetition time TR (the time between successive excitation of a particular slice) is the same for all slices in this first variant and is at least:

$$TR \geq N_{slc} \times TS + \left(\frac{d \cdot N_{slc}}{|v_{return}|}\right) + \frac{|v_1| + |v_{return}|}{a_1} + \frac{|v_1| + |v_{return}|}{a_2} \quad (6)$$

wherein the first term is the time for the sweep with data acquisition, the second term the time for the return sweep, the third term the time for the two acceleration phases and the fourth term the time for the two braking phases. The reason for using "≥" is because the time can be optionally extended by the insertion of pauses (preferably after reaching the end position or starting position). This is not, however, necessary as a rule in this variant because the magnetization is already able to almost completely relax during the minimum repetition time (which is the case approximately after the fivefold T1 time of the tissue). The repetition time can therefore be regarded as infinite with this method, which is an advantage for most relevant applications (T2-TSE, DW-EPI).

With the second variant of the first embodiment (data acquisition during the outward and return sweeps according to FIG. 3) the repetition time varies from slice to slice. This has no influence on the image contrast provided that a complete relaxation of the magnetization during two successive excitations can be assumed. In order to also force this for the slices which for example are located in the vicinity of the end position, it may be preferable in this variant to insert a pause between the sweeps (outward and return sweeps).

A second basic embodiment of the invention can be regarded as a type of "hybrid technique" of any multi-shot acquisition technique with continuous table feed in the prior art and the technique according to the invention with only one excitation per sweep. With such a "hybrid technique" any number of sweeps $N_{sweep}$ with data acquisition can be chosen between 1 and the number of excitations per image. The number of excitations per sweep is then up to:

$$N_{exc\ per\ sweep} = \text{CEIL}\left(\frac{N_{exc}}{N_{sweep}}\right). \quad (7)$$

where CEIL( ) means that the expression in parentheses is to be rounded up to the next integer value. Accordingly, instead of the number of sweeps the number of excitations per sweep $N_{exc\ per\ sweep}$ between 1 and total number of excitations $N_{exc}$ can be predetermined. The number of sweeps with data acquisition is then:

$$N_{sweep} = \text{CEIL}\left(\frac{N_{exc}}{N_{exc\ per\ sweep}}\right). \quad (8)$$

In the special case $N_{sweep}=1$ (only one sweep) this technique merges with the conventional technique. In the special case $N_{exc}=N_{sweep}$ the technique is identical to the first embodiment of the invention. For the remaining cases it holds true that the number of excitations per sweep is reduced approximately by a factor $N_{sweep}$. Accordingly, the effective scan region (in other words the region in the scanner in which data is acquired) in the z direction is reduced approximately by a factor $N_{sweep}$ with respect to the conventional technique. The problems mentioned in the introduction with the varying scan position are reduced accordingly.

Figure 4:
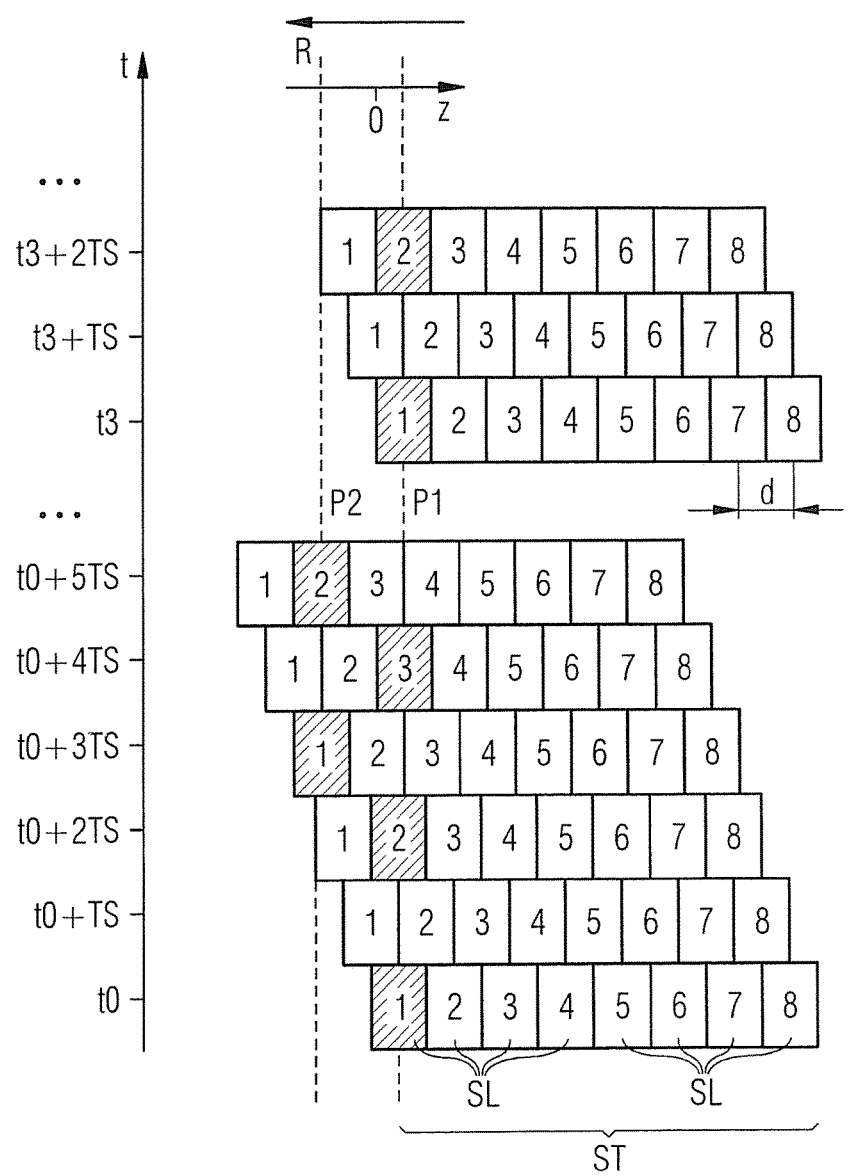
FIG. 4 is a schematic illustration of the execution of a magnetic resonance measurement according to the invention in accordance with a third embodiment.

FIG. 4 shows a simple example of this embodiment. Here, two excitations take place per sweep. There are two scan positions P1, P2 (position regions in which raw data is acquired) in the magnetic resonance scanner 3 that are preferably distributed symmetrically around the isocenter of the magnet. A slice is measured each time it is situated at the location of one of the two scan positions P1, P2.

At point in time t0 the slice "1" is situated at a first scan position P1 and is measured a first time. At the next measuring time t0+TS the slice, which bounds the slice package to be measured on the left, is situated at the second scan position P2. The data therefrom are not needed. An excitation without data acquisition can nevertheless be meaningful because this excitation also influences the contrast of the slice "1" on account of the crosstalk between the slices. One time interval TS later again the slice "2" is situated at the first scan position P1 and is measured. At the next measuring time t0+3TS the slice "1" has reached the second scan position P2 and is measured a second time.

The table feed per time interval TS and thereby the feed speed $v_2$ are halved compared with the embodiment according to FIG. 2, generally:

$$|v_2| = \frac{d}{N_{exc\ per\ sweep} \cdot TS}. \qquad (9)$$

The number of sweeps with data acquisition is reduced approximately by the factor $N_{exc\ per\ sweep}$.

The remaining excitations of the slice "1" take place during the second sweep, beginning at point in time "t3". The slice "1" is again situated at the first scan position "P1". In the embodiment drawn in FIG. 3 the data acquisition takes place only in the "forward direction".

The repetition time TR varies in this embodiment. In the example the time 3TS elapses between the different excitations of a particular slice during a sweep while the time t3-t0, which in general is considerably longer than 3TS, elapses between the last excitation of the slice during the first sweep and the first excitation of the slice during the second sweep. Possible degradation of image quality as a consequence of the varying TR can be countered by further measures (such as for example an extra excitation per sweep in order to achieve the stationary state of equilibrium, a steady-state preparation pulse prior to the first excitation of a sweep, by a measurement of peripheral k-space lines during the first excitation of a sweep, etc.).

Figure 3:
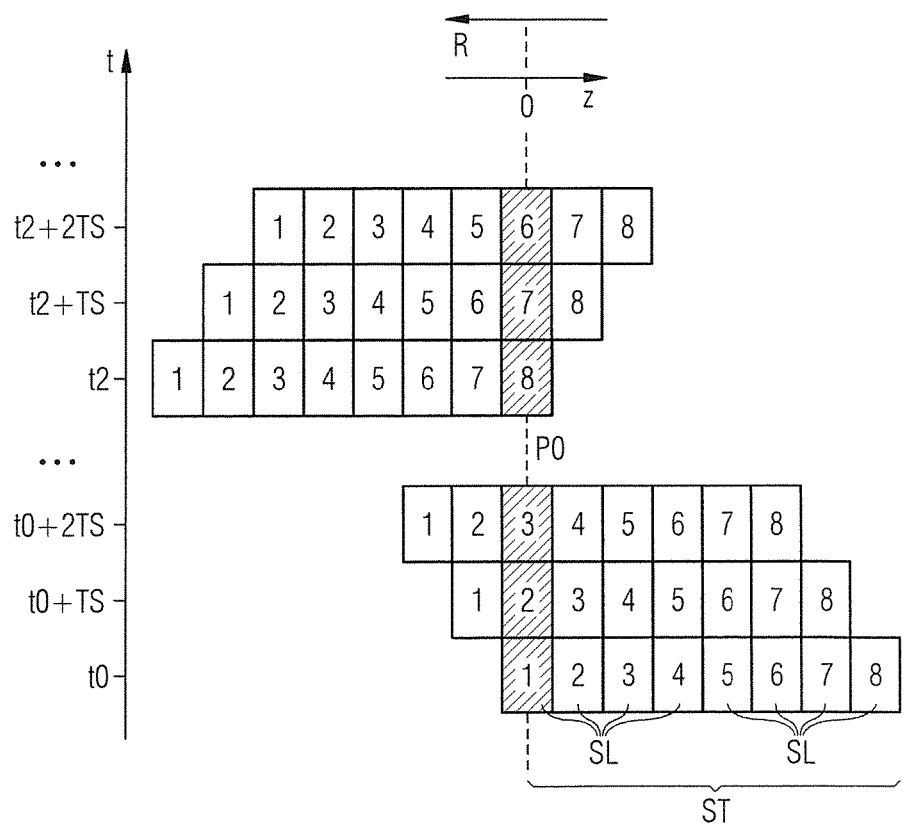
FIG. 3 is a schematic illustration of the execution of a magnetic resonance measurement according to the invention in accordance with a second embodiment.

The previously described embodiments according to FIGS. 2 to 4 are all applications of the second family of sequence types defined above ("multi-shot sequences").

Figure 5:
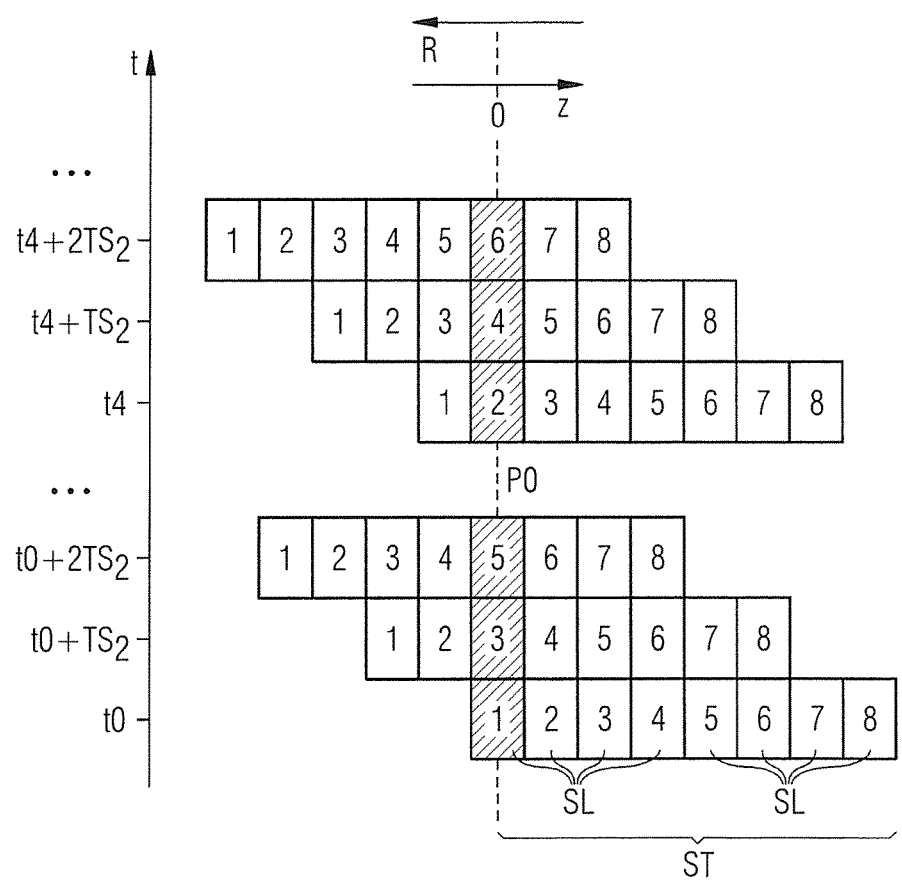
FIG. 5 is a schematic illustration of the execution of a magnetic resonance measurement according to the invention in accordance with a fourth embodiment.

FIG. 5 shows a schematic illustration of an application of the invention for sequence types of the third family. The aim of this embodiment is to reduce the crosstalk between the slices without accepting the disadvantages of interleaving. To this end, in each sweep with data acquisition only every $N_{sweep}$-th slice is measured. The remaining slices (not measured in the first sweep) are measured in ($N_{sweep}-1$) further sweeps. In each of the remaining sweeps, again only every $N_{sweep}$-th slice is measured. The starting position is incremented between successive sweeps (with data acquisition in one direction) for example by one slice increment d.

FIG. 5 shows a very simple example in this regard. Here the slices are acquired in two sweeps. In the first sweep, firstly the "odd-numbered" slices are excited and measured, beginning with the slice "1" at point in time t0. The measurement of the "even-numbered" slices takes place in a second sweep, beginning with the measurement of the slice "2" at point in time t4.

If the time TA+TP between the measurement of two successive slices is recorded, then the table speed $v_4$ is increased by a factor $N_{sweep}$ compared with the conventional technique (equation (2)):

$$V_4 = \frac{N_{sweep} \cdot d}{TA + TP} = \frac{N_{sweep} \cdot d}{TS}. \qquad (10)$$

As mentioned in the introduction, the crosstalk is greatest between immediately adjacent slices and reduces exponentially with the time between the acquisition of said slices. The time $\Delta t_{NN}$ between the acquisition of two immediately adjacent slices is increased here from TA+TP (where in FIG. 5: TA+TP=TS$_2$) at least to the time between two successive sweeps (where in FIG. 5: $\Delta t_{NN}$=t4-t0). In the case of a raw data acquisition in one direction, the time $\Delta t_{NN}$ is at least:

$$\Delta t_{NN} > \frac{N_{slc} d}{v_4} = \frac{N_{slc}}{N_{sweep}} TS, \text{ for } N_{sweep} > 1. \qquad (11)$$

wherein $N_{slc}$ denotes the total number of slices and $N_{sweep}$ the total number of sweeps with data acquisition. More than two sweeps ($N_{sweep}>2$) are only necessary and meaningful if the crosstalk between next-but-one adjacent slices is not negligible.

Depending on the embodiment, the method according to the invention has a number of advantages which are summarized here once again:

Compared with the classical technique in which the slices are acquired successively during a single sweep in the isocenter in accordance with equation (1) an efficiency gain results, in particular for scanning techniques having a long repetition time. "Efficiency gain" here means a reduction in the examination time. With the classical technique, for a given length of the field of examination the acquisition time is directly proportional to the table speed. The latter is quasi-predetermined in the classical technique by the parameters which determine image contrast and resolution (TR, Nexc, d). With the technique according to the invention on the other hand, the efficiency is proportional to the table speed and the number of sweeps. In this situation the table speed is limited upwards quasi only by the acquisition time per excitation TA and is thereby freely selectable for such acquisition techniques in which a complete relaxation of the magnetization between the excitations is desired, regardless of the resolution and contrast-determining parameters.

In the prior art, different interleaving techniques involving continuous table feed are known that make it possible to increase the efficiency compared with classical scanning technique. The advantages of the technique according to the invention compared with these known interleaving techniques result from the disadvantages of the latter: With the interleaved technique, the slices are no longer acquired consecutively in the isocenter of the system. With the multi-shot techniques, the excitation at different locations within the MR system may result in image artifacts and thereby to a degradation in image quality as a consequence of the changed scanning conditions. In addition, with some interleaving techniques intermediate image artifacts occur because adjacent slices are acquired differently. With the single-shot techniques, the interleaving likewise results in intermediate image artifacts because adjacent slices are necessarily acquired at different locations of the MR system. As a rule the time also varies between the acquisition of a particular slice and the acquisition of its adjacent slice. The consequence is a variation in contrast between the slices. On the other hand, depending on the embodiment, the technique according to the invention permits an increase in efficiency totally without said disadvantages or at least with a major reduction in the disadvantageous effects.

With the preferred applications of the technique according to the invention (T2 imaging with turbo-spin sequences, diffusion-weighted imaging with spin-echo EPI) the desired TR time is frequently infinite. An infinite TR means that a complete relaxation of the magnetization between the excitations is desired. With the technique according to the invention, for the stated applications the TR time is equal to the time between the sweeps. This frequently very closely approaches the desired complete relaxation. With the normal extent of the field of examination in the table feed direction (>=1 m) and table speeds (<=50 mm/s) TR is therefore greater than or equal to 2 s. This still does not include the time for startup, braking, return sweep. However, on account of a larger field of examination or lower table speed (SAR, . . . ) a TR in the order of 10 s frequently results. With this TR, most tissue is almost completely relaxed. An SNR and/or contrast gain additionally results in this case.

With the interleaving techniques in the prior art, the travel distance of the table is frequently greater than the field of examination from which images are computed. This can be seen for example by way of the example in FIG. 4. At the beginning of the measurement (point in time t0) the first slice "1" is situated at the first scan position "P1". The measurement is finished when the last slice "8" has been completely measured and has just passed through the second scan position "P2". The table is then greater overall by the distance |P2–P1|+d·$N_{slc}$ (slice count $N_{slc}$=8 in FIG. 3), in other words by the distance |P2–P1|, than the region from which raw image data is acquired. The maximum extent of the field of examination in the z direction (table feed direction) is thereby smaller than the maximum design travel distance of the table. In the method according to the invention, depending on the embodiment variant of the invention, the maximum field of examination in the z direction is not reduced at all (apart from the travel distance which is required in order to brake and accelerate the table at the start and at the end of a sweep) or is at least reduced less compared with the maximum travel distance of the table.

Although the invention has been described above with reference to a magnetic resonance tomography system in the medical field, the invention can also be employed in magnetic resonance tomography systems used in science and/or industry. The term "unit" or "module" herein does not preclude those items from being composed of a number of components, which in some instances may be spatially distributed.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring magnetic resonance (MR) image data of a subject, comprising:
   from a control computer, operating an MR scanner, comprising a basic field magnet, a single radio-frequency (RF) reception coil, and a gradient coil system that generates a gradient field, while a subject is situated on a patient table in said MR scanner, in order to acquire raw image data from a plurality of slices in the subject, that form an image stack;
   from said control computer, operating said MR scanner to move said patient table with said subject thereon or to move said gradient field back and forth, relative to said basic field magnet and said gradient coil system, in a plurality of movement sweeps between a starting position and an end position, while acquiring, with said single RF reception coil, respective portions of a total set of said raw image data that is required for reconstruction of image data of said image stack, in different ones of said movement sweeps from said starting position to said end position or from said end position to said starting position;
   from said control computer, entering the acquired portions of raw image data into an electronic memory in order to compile, in said electronic memory, said total set of said raw image data; and
   via said control computer, making said total set of said raw image data available from said electronic memory in electronic form, as a data file.

2. A method as claimed in claim 1 comprising acquiring those portions of said total set of said raw image data which are needed to reconstruct image data of a particular slice in different sweeps among said plurality of sweeps.

3. A method as claimed in claim 2 comprising exciting nuclear spins in the individual slices multiple times, with each excitation occurring when the respective slice is situated at a defined position with respect to said basic field magnet and said gradient coil system.

4. A method as claimed in claim 2 comprising exciting nuclear spins in a respective slice multiple times within an individual sweep among said plurality of sweeps.

5. A method as claimed in claim 1 comprising exciting nuclear spins in each slice only once, with spins in respectively different slices of said slice package being excited during the same individual sweep of said multiple sweeps only when said different slices are separated from each other with at least one other slice therebetween, and wherein each excitation of each slice takes place when the respective slice is situated at a defined position relative to said basic field magnet and said gradient coil system.

6. A method as claimed in claim 5 comprising exciting nuclear spins only in every $n^{th}$ slice in an individual sweep among said plurality of sweeps.

7. A method as claimed in claim 1 comprising acquiring respective individual portions of said total set of said raw image data only during sweeps in one sweep direction.

8. A method as claimed in claim 1 comprising acquiring respective individual portions of said total set of said raw image data during sweeps in both sweep directions.

9. A method as claimed in claim 1 comprising operating said MR scanner with a predetermined waiting time between each two successive sweeps in said plurality of sweeps.

10. A method as claimed in claim 1 comprising reconstructing an MR image of said slice stack in an image reconstruction computer by executing an image reconstruction algorithm on said total set of said raw image data in said data file.

11. A magnetic resonance (MR) tomography system comprising:
   an MR scanner comprising a basic field magnet, a single radio-frequency (RF) reception coil, a patient table, and a gradient coil system;
   an electronic memory;
   a control computer configured to operate the MR scanner to acquire raw image data from a plurality of slices in the subject, that form an image stack;
   said control computer being configured to operate said MR scanner to move said patient table with said subject thereon or to move said gradient field back and forth, relative to said basic field magnet and said gradient coil system, in a plurality of movement sweeps between a starting position and an end position, while acquiring, with said single RF reception coil, respective portions of a total set of said raw image data that is required for reconstruction of image data of said image stack, in different ones of said movement sweeps from said starting position to said end position or from said end position to said starting position;

said control computer being configured to enter the acquired portions of raw image data into said electronic memory in order to compile, in said electronic memory, said total raw image data set; and said control computer being configured to make said total set of said raw image data available from said electronic memory in electronic form, as a data file.

12. An apparatus as claimed in claim 11 comprising an image reconstruction computer configured to reconstruct an MR image of said slice stack by executing an image reconstruction algorithm on said total set of said raw image data in said data file.

13. A non-transitory, computer-readable data storage medium encoded with programming instructions, said data storage medium being loaded into a control and processing computer of a magnetic resonance (MR) tomography system that also comprises an MR scanner comprising a basic field magnet, a single radio-frequency (RF) reception coil, a patient table, and a gradient coil system, said programming instructions causing said control and processing computer to:

operate said MR scanner in order to acquire raw image data from a plurality of slices in the subject, that form an image stack;

operate said MR scanner to move said patient table with said subject thereon or to move said gradient field back and forth, relative to said basic field magnet and said gradient coil system, in a plurality of movement sweeps between a starting position and an end position, while acquiring respective portions, with said single RF reception coil, of a total set of said raw image data that is required for reconstruction of image data of said image stack, in different ones of said movement sweeps from said starting position to said end position or from said end position to said starting position;

enter the acquired portions of raw image data into an electronic memory in order to compile, in said electronic memory, said total set of said raw image data; and make said total set of said raw image data available from said electronic memory in electronic form, as a data file.

14. A data storage medium as claimed in claim 13 wherein said programming instructions cause said control and processing computer to reconstruct an MR image of said image stack from said total set of said raw image data in said data file.

* * * * *